United States Patent [19]
Hibino

[11] Patent Number: 5,705,426
[45] Date of Patent: Jan. 6, 1998

[54] METHOD OF FORMING SEMICONDUCTOR DEVICE HAVING PLANARIZED WIRING WITH GOOD THERMAL RESISTANCE

[75] Inventor: Satoshi Hibino, Hamamatsu, Japan

[73] Assignee: Yamaha Corporation, Japan

[21] Appl. No.: 757,501

[22] Filed: Nov. 27, 1996

Related U.S. Application Data

[62] Division of Ser. No. 494,265, Jun. 23, 1995, Pat. No. 5,637,924.

[30] Foreign Application Priority Data

Jun. 27, 1994 [JP] Japan .................... 6-167408

[51] Int. Cl.⁶ ............................................. H01L 21/28
[52] U.S. Cl. ........................ 437/190; 437/192; 437/195
[58] Field of Search .............................. 437/190, 192, 437/194, 195, 203; 257/751, 763, 775

[56] References Cited

U.S. PATENT DOCUMENTS

| | | | |
|---|---|---|---|
| 4,876,223 | 10/1989 | Yoda et al. | 437/228 |
| 5,233,217 | 8/1993 | Dixit et al. | 257/530 |
| 5,432,381 | 7/1995 | Melsner | 257/774 |
| 5,534,461 | 7/1996 | Kuwajima | 437/192 |
| 5,534,463 | 7/1996 | Lee et al. | 437/195 |
| 5,545,926 | 8/1996 | Kohyama et al. | 257/774 |

FOREIGN PATENT DOCUMENTS 63-077117  4/1988  Japan .

Primary Examiner—David Graybill
Assistant Examiner—Thomas G. Bilodeau
Attorney, Agent, or Firm—Ostrolenk, Faber, Gerb & Soffen, LLP

[57] ABSTRACT

A method of forming conductive wiring on a semiconductor substrate. A plurality of contact holes having different sizes are formed in an insulating film formed on the substrate. A first barrier metal layer is formed on the insulating film, and a tungsten layer is uniformly formed on the first barrier metal layer. The tungsten layer is etched back to form plug-shaped tungsten regions in small contact holes and tapered tungsten regions in large contact holes. The central area of the first barrier metal layer in the large contact hole is exposed. A second barrier metal layer is formed covering the plug-shaped tungsten region and the tapered tungsten region and the exposed first barrier metal layer and sandwiching the plug-shaped and tapered tungsten regions between the first and second barrier metal layers, preventing punch-through of Al atoms from an Al layer to be thereafter formed, into the substrate, even when the first barrier metal layer is damaged during etch-back.

26 Claims, 6 Drawing Sheets

METHOD OF FORMING SEMICONDUCTOR DEVICE HAVING PLANARIZED WIRING WITH GOOD THERMAL RESISTANCE

This is a division of application Ser. No. 08/494,265, filed Jun. 23, 1995, now U.S. Pat. No. 5,637,924.

BACKGROUND OF THE INVENTION a) Field of the Invention

The present invention relates to a semiconductor device and its manufacturing method, and more particularly to a semiconductor device having a planarized wiring layer and its manufacturing method.

b) Description of the Related Art

Planarizing technique is important for highly integrated semiconductor devices to maintain a good step coverage and a high precision of photolithography. Contact holes or via holes are formed in an insulating film overlying a semiconductor substrate or a wiring, and thereafter a wiring layer is formed on the insulating film to make electrical contacts with the underlying conductive regions through the contact holes or via holes. If contact holes or via holes can be fully filled with conductive material, a wiring layer formed thereon can be planarized. Known as a contact hole (via hole) burying technique are a selective growth technique of refractory metal and a combined technique of chemical vapor deposition (CVD, blanket deposition) and etch-back of a refractory metal layer.

This latter technique typically forms a tungsten (W) layer conformal to the topography of an underlying layer by CVD through reduction of $WF_6$ by silane and hydrogen. The W layer by CVD is grown also on the side wall of a contact hole. If the W layer is grown thicker than the radius of a contact hole, the contact hole is buried by the W layer growing from the side wall. The W layer grown on a flat surface outside of the contact hole is removed by etch-back technique. In this manner, the W layer can be left only in the contact hole.

The size of each contact hole for the source/drain regions of a MOS transistor formed on a semiconductor substrate is small because of a limited area of the source/drain regions, whereas the size of a contact hole for use in stabilizing the potential of a wall is made sufficiently large so as to make a voltage drop negligible even if a large current is flowed. Contact holes having different diameters are therefore formed in an insulating layer. In this case, it takes a long time to bury a large contact hole by tungsten CVD. An unnecessarily thick W layer is therefore deposited on a flat surface and at a small contact hole. This burying technique is therefore impractical. Although the planarizing technique combining blanket growth and etch-back of W is particularly suitable for burying deep contact holes of uniform and small diameters, it is difficult to bury a plurality of contact holes having different diameters.

A W layer directly deposited on an insulating film such as silicon oxide has poor adhesion or contact with the insulating film. An adhesion layer made of a Ti/TiN laminate is generally deposited first on an insulating film with contact holes, and then a W layer is deposited on the adhesion layer. This adhesion layer also has a function of preventing mutual diffusion of Si in the substrate and W in the W layer. The adhesion layer has generally a thickness of 10 nm or more. A Ti single layer having a thickness of 20 nm or more may be used instead of a laminate. In etch-back, W is etched and the adhesion layer is left unetched.

SUMMARY OF THE INVENTION

It is an object of the present invention to improve heat resistance of a wiring layer without degrading the buried condition of contact holes.

According to one aspect of the present invention, there is provided a semiconductor device including: (a) a semiconductor substrate having a surface with a contact area; (b) an insulating film covering the surface of the semiconductor substrate and having a contact hole corresponding to the contact area of the surface; (c) a conductive adhesion layer formed to cover a bottom and side wall of the contact hole; (d) a refractory metal layer formed on the adhesion layer, and filling the contact hole; (e) a conductive barrier layer formed to cover the refractory metal layer and adhesion layer at an opening portion of the contact hole; and (f) an Al or Al alloy layer formed on the barrier layer and electrically connected to the refractory metal layer and adhesion layer.

The barrier layer is interposed between the Al or Al alloy layer and the refractory metal layer and adhesion layer at the opening of a contact hole. The barrier layer prevents diffusion of Al in the Al or Al alloy layer into the substrate surface, during a thermal treatment or the like after a wiring pattern is formed.

According to another aspect of the present invention, there is provided a method for manufacturing a semiconductor device comprising the steps of: (a) forming a plurality of contact holes in an insulating film covering a surface of a semiconductor substrate, corresponding to contact areas of different sizes defined in the surface of the semiconductor substrate; (b) forming a conductive adhesion layer on the insulating film, the adhesion layer covering a bottom and side wall of each of the contact holes; (c) forming a refactory metal layer on the adhesion layer, the refractory metal layer filling each of the contact holes; (d) etching back the refractory metal layer to partially expose the adhesion layer at a central area of the bottom of one of the contact holes having a larger size and to partially leave the refractory metal layer along a side wall of the one contact hole; (e) forming a conductive barrier layer over the etched-back substrate; (f) forming an Al or Al alloy layer covering the barrier layer; and (g) patterning a laminate of the adhesion layer, barrier layer, and Al or Al alloy layer to form desired wiring patterns, the wiring patterns including a left portion of the adhesion layer, a left portion of the refractory metal layer, a left portion of the barrier layer, and a left portion of the Al or Al alloy layer and being electrically connected to associated contact area or areas via associated contact hole or holes.

After a refractory metal layer such as of W is buried in contact holes having large and small sizes by blanket CVD and etched back, a barrier layer is formed on a large contact hole to cover a left portion of the refractory metal layer and an exposed area of the adhesion layer. The barrier layer provides a barrier function in addition to that of the adhesion layer. Al diffusion into the substrate surface can be prevented.

DETAILED DESCRIPTION OF THE PREFERRED EMBODIMENTS

The basics of the invention studied by the inventor will be first given prior to the description of embodiments of the invention.

The above-described conventional technique has been found unsatisfactory in that if there is a shallow p-n junction near a contact area of the substrate surface, a junction leak current increases. According to the studies by the inventor, this leak current increase has been confirmed as resulting from diffusion of Al in an Al alloy layer into the substrate surface via an interface between an adhesion layer and a W layer, during a thermal treatment or the like after the formation of a wiring pattern.

If there are both small contact holes and large contact holes from some reason of designs, a W layer on the central area of a large contact hole is made flat and is removed by etch-back. An adhesion layer exposed by etch-back may be damaged by over-etch after the W layer is removed. An Al alloy layer deposited thereafter is electrically connected to the substrate surface only via the damaged thin adhesion layer. It has been found that in such a case the adhesion layer may have insufficient barrier function and the heat resistance is degraded by Al diffusion.

The inventor has thought of making an adhesion layer thicker in order to improve the heat resistance. If some thickness of an adhesion layer is to be ensured at the bottom of the contact hole, it is necessary to deposit a TiN film having a thickness of 100 nm or more at an upper flat area. Step coverage of a TiN film is not good at the opening portion of a contact hole. A W layer deposited thereafter may have a seam, disabling to realize a sufficient buried condition.

Embodiments of the invention will be described with reference to the accompanying drawings.

Figure 1:
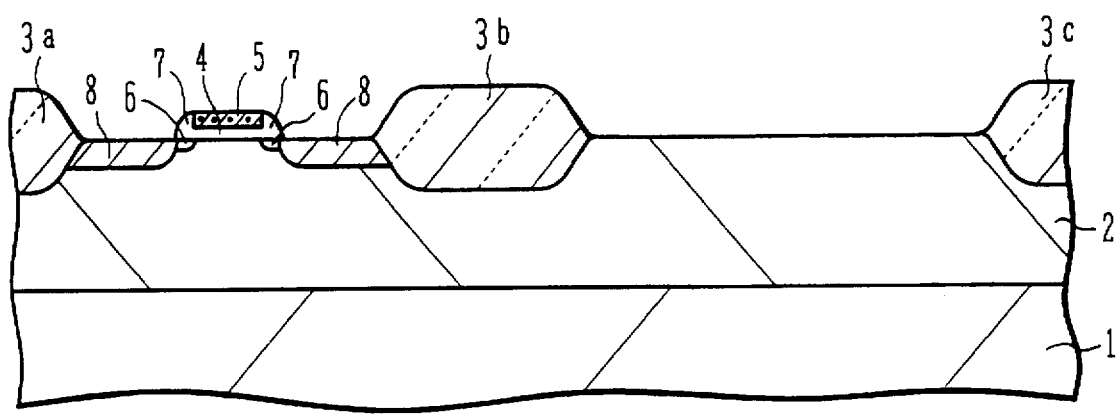
FIGS. 1 to 8 are cross sectional views of a substrate illustrating the main processes of a method of manufacturing a semiconductor device according to an embodiment of the present invention.

Referring to FIG. 1, in the surface region of an n⁻-type silicon substrate 1, a p⁻-type well 2 is formed. On the surface of the p⁻-type well 2, field oxide films 3a, 3b, and 3c are selectively formed. The field oxide film is formed by local oxidation of silicon (LOCOS) by first forming a thin buffer oxide film on the surface of the semiconductor substrate, forming a nitride film pattern functioning as an oxidation mask, and then oxidizing the substrate surface not covered with the mask. Oxidation of silicon accompanies a volume increase and produces a sloped seep at the edge.

The field oxide films 3a, 3b, and 3c are shown separately in FIG. 1. They may be formed to be continuous.

The field oxide films 3a and 3b surround an active region in which a transistor is formed. A MOS transistor is formed in this active region. On the surface of the well 2, a thin gate oxide film is formed by thermal oxidation. On the gate oxide film, a polycrystalline silicon layer is formed. The polycrystalline silicon layer and gate oxide film are patterned to form a gate oxide film 45 and a polycrystalline silicon gate electrode 5.

Lightly doped drain (LDD) regions 6 are formed by implanting n-type impurity ions from the surface of the semiconductor substrate after an unnecessary area is covered with a resist pattern. Thereafter, this resist pattern is removed and a silicon oxide film is formed on the substrate surface by CVD. The silicon oxide film is anisotropically etched to form a side wall spacer oxide film 7 on the side walls of the gate electrode. An unnecessary area is again covered with a resist pattern, and n-type impurity ions are implanted into the active region to form n⁺-type source/drain regions 8. The LDD regions 6 under the side wall spacer oxide film 7 are prevented from being implanted, to remain in a lightly doped state. After the resist pattern serving as the ion implantation mask is removed, the structure shown in FIG. 1 is obtained. The source/drain regions 8 of the MOS transistor formed in the above manner each have a width of about 1.8 μm in the cross section.

Figure 2:
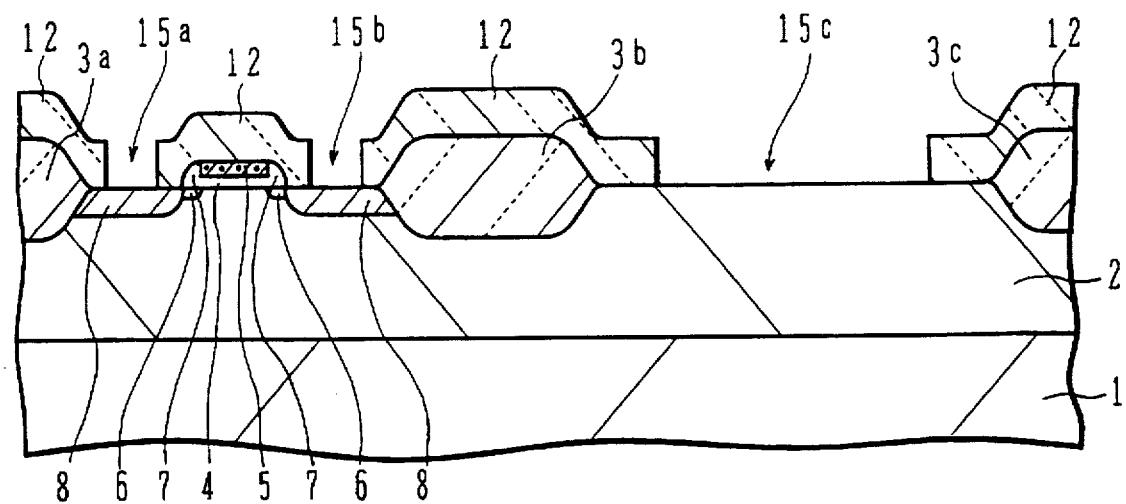

Referring to FIG. 2, an insulating film 12 of silicon oxide is deposited by CVD over the surface of the semiconductor substrate. Silane, disilane, and other materials may be used as silicon source materials, and $O_2$, $N_2O$, and other materials may be used as oxidizing agents. The insulating film 12 has a topography transferring the configuration of the underlie structure, e.g., slopes of field oxide layers and side wall spacers.

After the insulating film 12 is formed, a photoresist layer is coated over the surface of the semiconductor substrate to form a resist mask through exposure and development. By using this resist mask as an etching mask, the insulating film 12 is etched by reactive ion etching. In this manner, contact holes 15a and 15b for the source/drain regions 8 and a contact hole 15c for the well region 2 are formed in the insulating film 12. The width of each of the contact holes 15a and 15b for the source/drain regions 8 is, for example, about 0.8 μm with alignment tolerance of about 0.5 μm on both the ends of each of the source/drain regions 8.

The width of the contact hole 15c for the well region 2 is not determined from a contact resistance or the like, but is determined from the criterion to be described later.

Figure 3:
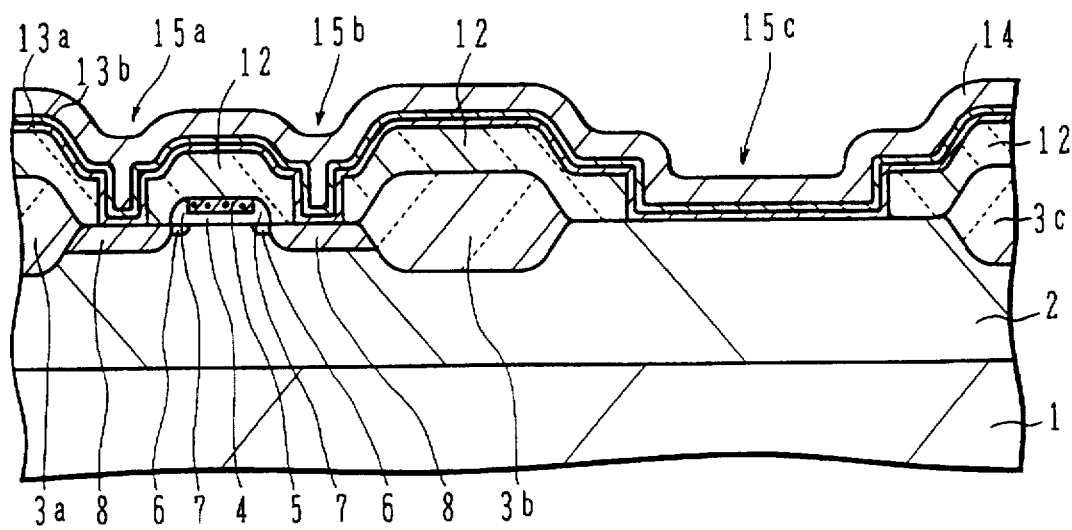

As shown in FIG. 3, a Ti layer 13a and a TiN layer 13b having a total thickness of 10 to 50 nm and serving as an adhesion layer with a function of barrier for an Al alloy layer deposited afterward are deposited by sputtering over the surface of the semiconductor substrate. The adhesion layer may be formed of Ti, Ti/TiN, TiW or combinations thereof.

Figure 9A:
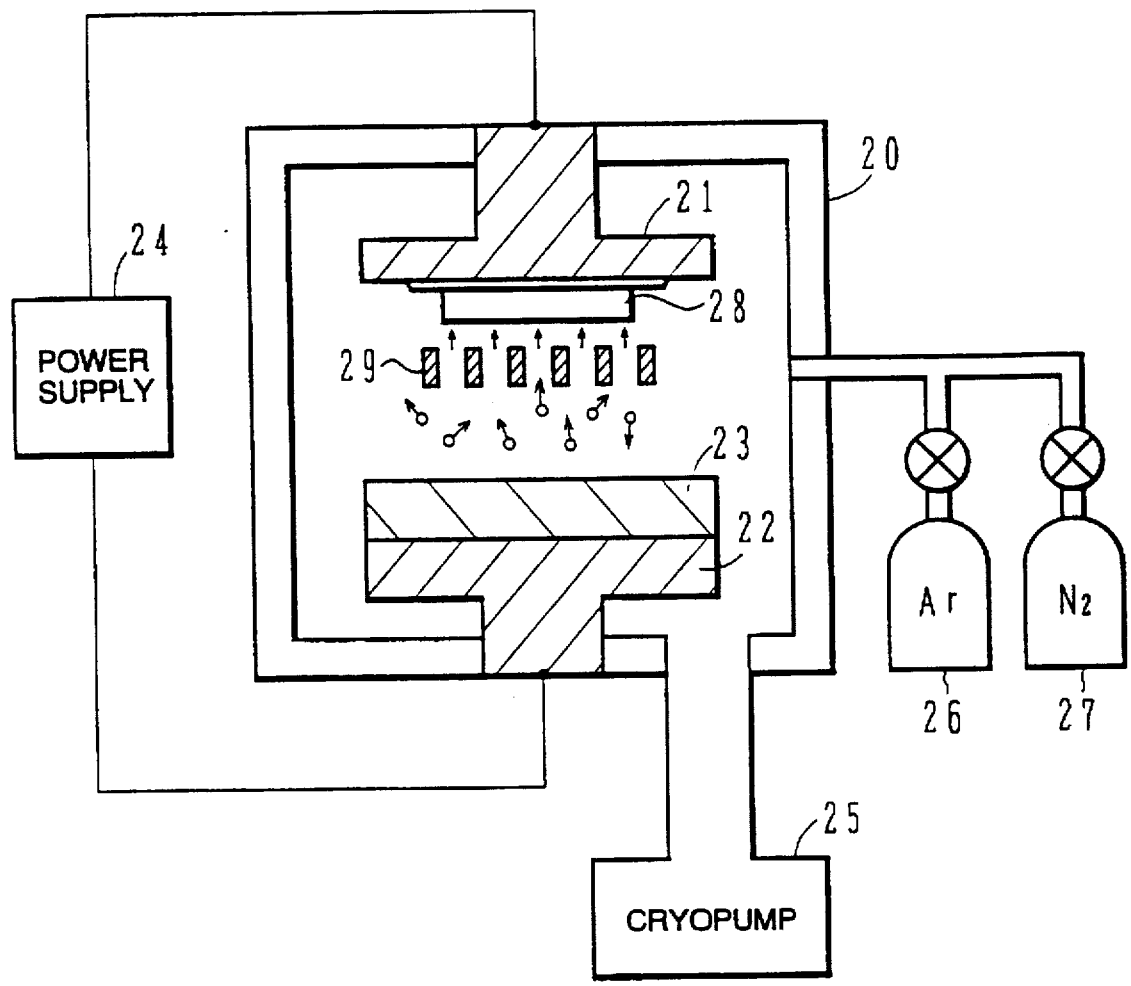
FIGS. 9A and 9B are a cross sectional view of a sputtering system and a schematic perspective view of a filter used in the sputtering system.
Figure 9B:
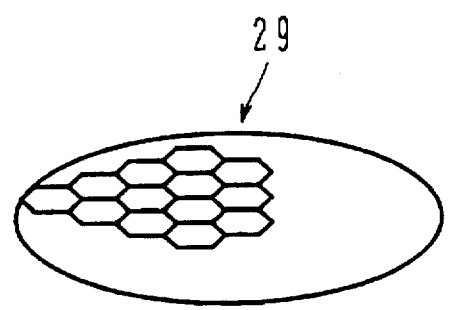

FIGS. 9A and 9B are schematic diagrams showing the structure of a sputtering system. In the preferred embodiment, a collimate sputtering apparatus is used, however, it is not limited to the collimate sputtering apparatus. Parallel plate electrodes 21 and 22 are disposed facing each other in a vacuum chamber 20. A target 23 to be sputtered is placed on the lower electrode 22. A semiconductor substrate 28 to be deposited with a sputter film is disposed on the lower surface of the upper electrode 21 by a chuck. The electrodes 21 and 22 are connected to a radio frequency (RF) power source, for example, at 13.56 MHz. A gas supply pipe communicates with the vacuum chamber 20. A work (plasma) gas source 26 such as Ar and an $N_2$ gas source 27 to be used as a reactive gas for reactive sputtering are connected via valves to the gas supply pipe. An evacuation system 25 such as a cryopump is connected to the vacuum chamber 20.

A filter 29 for arranging the directions of incoming molecules uniformly is disposed near the substrate. The filter 29 and semiconductor substrate 28 are maintained at a floating potential.

FIG. 9B is a schematic diagram showing the structure of the filter 29 having honeycomb openings. Only those molecules, atoms, and the like coming from the target 23 and passing through the openings reach the substrate 28.

In depositing a Ti sputter layer, Ti material is used as the target 23. The work gas Ar is introduced into the vacuum chamber 20 and a radio frequency power is supplied to generate plasma. Ti particles sputtered from the target 28 by Ar particles in the plasma pass through the filter 29 and are deposited on the substrate 28.

In depositing a TiN sputter layer, a work Ar gas as well as a reactive $N_2$ gas is supplied. Ti atoms sputtered from the Ti target 23 react with $N_2$ or N in the vacuum chamber 20 and TiN is deposited on the substrate 28.

In depositing the Ti sputter layer 13a, the work gas, for example, Ar gas, is flowed at a flow rate of 80 sccm, at a pressure of 3 mTorr, at an RF power of 1 kW, and at a substrate temperature of 150° C.

In depositing the TiN sputter layer 13b, the work gas, for example, Ar gas, is flowed at a flow rate of 40 sccm, and the reactive $N_2$ gas is flowed at a flow rate of 40 sccm, at a total pressure of 4 mTorr, at an RF power of 5 kW, and at a substrate temperature of 150° C.

Returning back to FIG. 3, after the barrier metal layers 13a and 13b are formed, a W layer 14 is deposited over the substrate surface by CVD. CVD of the W layer 14 is performed by flowing source gases $WF_6+H_2$, at a total pressure of 80 Torr and at a substrate temperature of 450° C. The W layer grows also on the side walls of the contact holes 15a and 15b, and the inner spaces of the contact holes are gradually buried with the W layer. The W layer continues to be grown until the inner spaces of the contact holes 15a and 15b are completely buried. During this growth, the W layer 14 grows also on the area other than the contact holes. The contact hole 15c for the well region 2 is large so that this hole 15c is not buried completely, but the W layer conformal to the topography of the underlie layer is deposited on the contact hole 15c.

Figure 4:
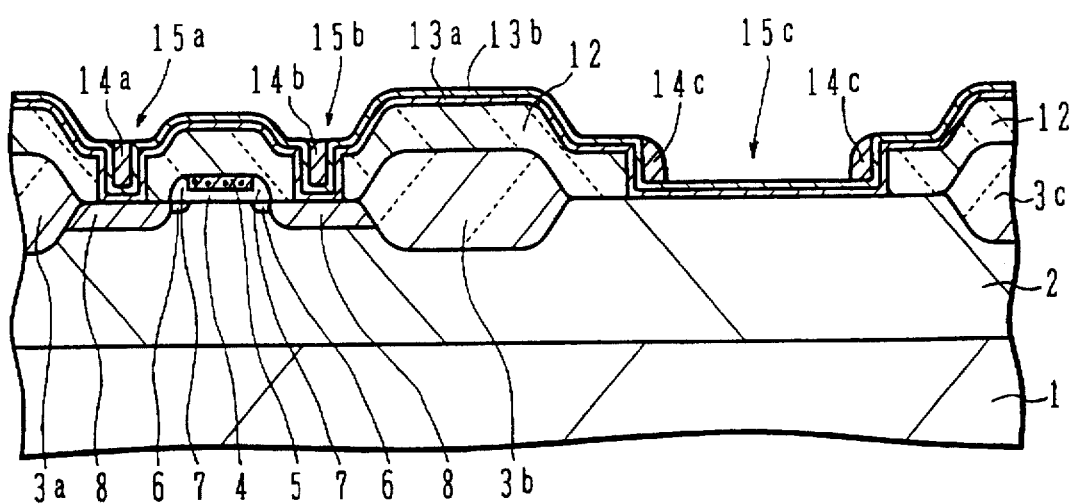

As shown in FIG. 4, the W film 14 having buried the contact holes 15a and 15b for the source/drain regions 8 of the MOS transistor is removed by etch-back technique. This etch-back continues until the W film above the insulating film 12 near the contact holes 15a and 15b is completely etched. The etch-back is performed by flowing the etching gas, for example, $SF_6+Ar$, at a pressure of 250 mTorr, at an RF power of 400 W, and at a substrate temperature of 30° C.

The surfaces of the contact holes 15a and 15b for the source/drain regions 8 are planarized leaving only W plugs 14a and 14b in the contact holes.

In the contact hole 15c for the well region 2, the W layer is fully removed at the flat area by anisotropic etching. Only a W region 14c is left on the side wall of the contact hole 15c and a central portion of the barrier metal layer 13b is exposed at a bottom of the contact hole 15c. This is also the case for wide contact holes other than the well contact. This W region 14c left on the side wall has a tapered shape in section so that the step of the contact hole is substantially relieved.

If the surface of a W layer is irregular, over-etch becomes necessary for etching back the W layer completely. As a result, the exposed adhesion layer (Ti+TiN layer) is damaged.

Figure 5:
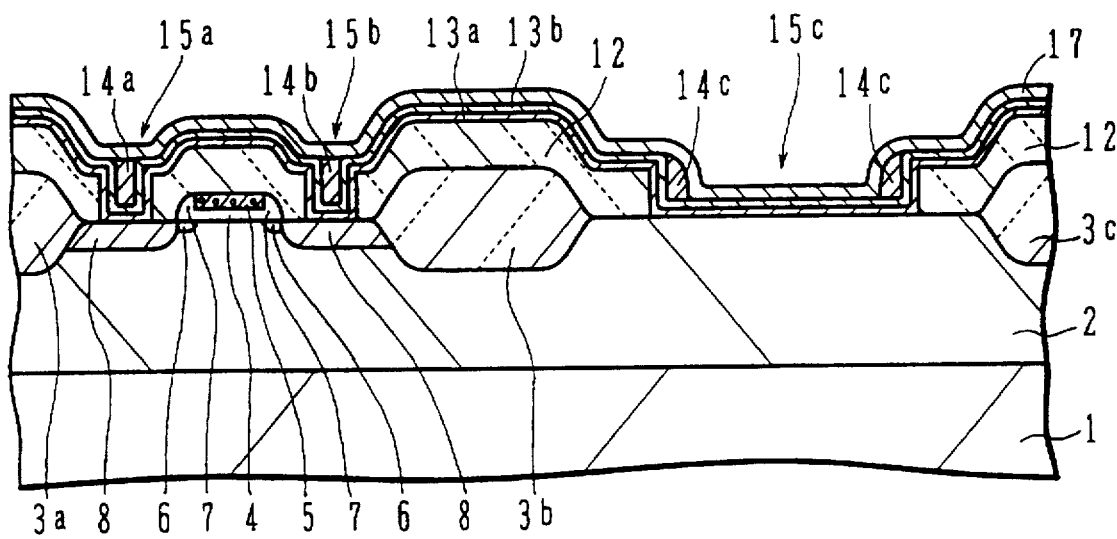

As shown in FIG. 5, a barrier metal layer 17 made of conductive and heat resistive material is formed over the substrate surface, covering the W layers 14a, 14b, and 14c, and the exposed adhesion layer 13. The barrier metal layer 17 electrically and physically contacts the barrier metal layer 13b at the bottom of the contact hole 15c. A thickness of the barrier layer 17 is sufficient if it is 20 nm or more. For example, a TiN film having a thickness of 100 nm and formed by reactive sputtering is used as the barrier layer 17. The barrier layer may be formed by using TiN, $WSi_x$, $MoSi_x$, TiW, or the combinations thereof.

Figure 6:
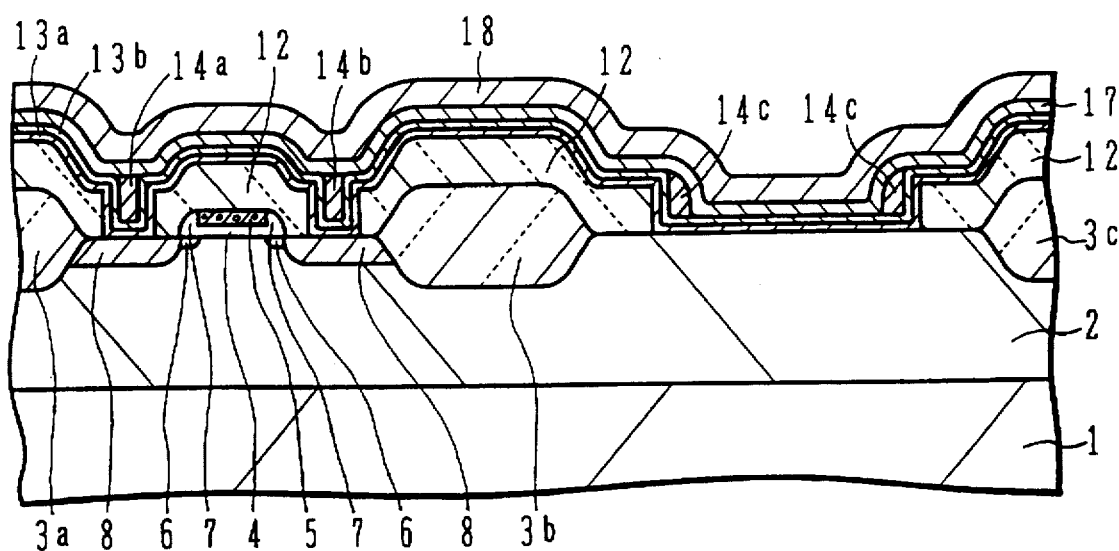

As shown in FIG. 6, an Al alloy layer (main wiring layer) 18 is formed over the substrate surface, covering the barrier layer 17. For example, an Al—Si—Cu alloy layer having a thickness of 500 nm and formed by sputtering is used as the Al alloy layer 18. An Al layer may be used instead of the Al alloy layer 18. Even if the adhesion layers 13a and 13b, which collectively serve as barrier metal layers, are damaged as the bottom of the contact hole 15c during the etch-back process of the W layer, the barrier metal layer 17 serve as a compensating barrier layer for the Al alloy layer 18 at the bottom of the contact hole 15c.

Figure 7:
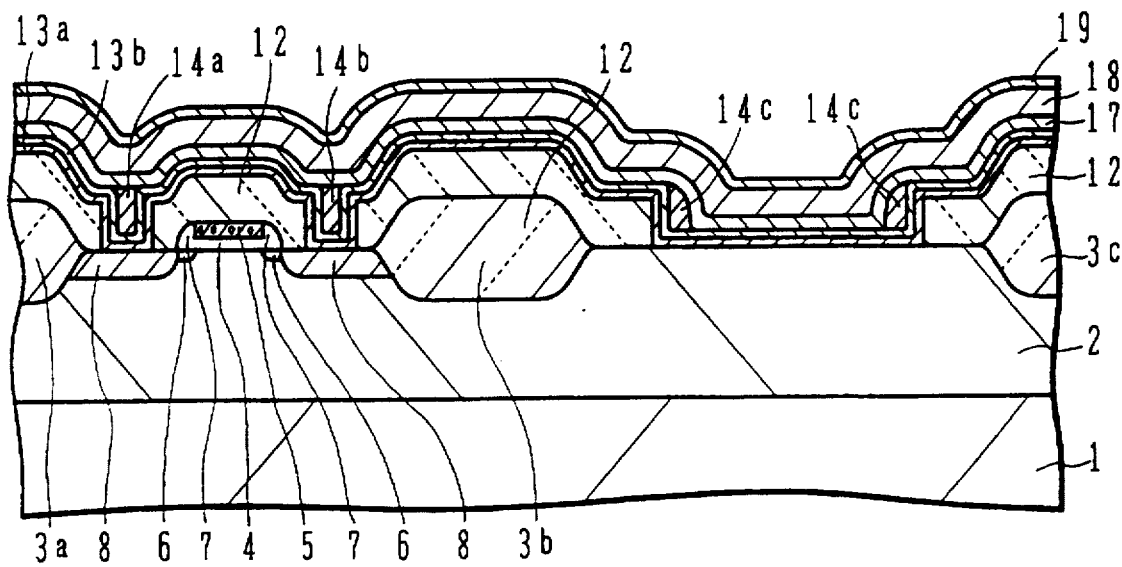

As shown in FIG. 7, an anti-reflection (AR) layer 19 made of TiN or the like is formed on the Al alloy layer 18 if necessary. A laminate of the adhesion layer 13, barrier layer 17, Al alloy layer 18, and AR layer 19 is patterned to form a desired wiring pattern, by photolithography and selective etching.

Figure 8:
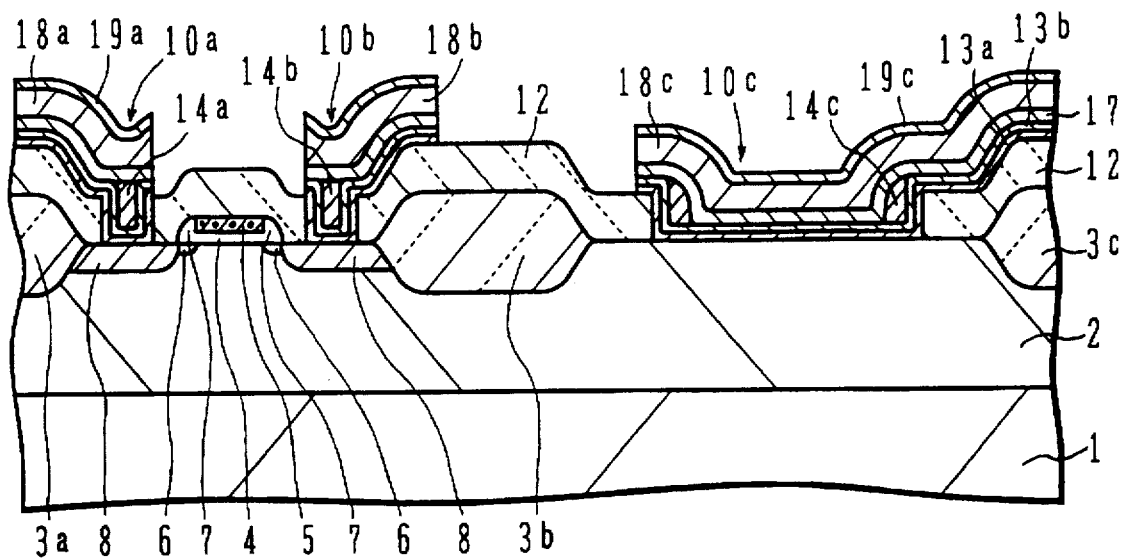

FIG. 8 shows the patterned wiring layer. The wiring pattern 10a and 10b each include a left portion of the adhesion layer 18c, a left portion of the W layer 14 which is a W plug 14a or 14b, a left portion of the barrier layer 17, a left portion 18a or 18b of the Al alloy layer 18, and a left portion 19a or 19b of the AR layer 19, and are connected to a corresponding contact area via the contact hole 15a or 15b. The wiring pattern 10c includes a left portion of the adhesion layer 13c, a left portion of the W layer 14 which is a side wall W layer area 14c, a left portion of the barrier layer 17, a left portion 18c of the Al alloy layer 18, and a left portion 19c of the AR layer 19, and are connected to a corresponding contact area via the contact hole 15c. The anti-reflection films 19a, 19b, and 19c may be removed or left. For a relationship between the shapes of contact holes and the thickness of a wiring layer, techniques disclosed in U.S. patent application Ser. No. 8/397,616 filed on Mar. 2, 1995 now U.S. Pat. No. 5,534,461, may be used, which is incorporated herein by reference.

After the wiring patterns 10a, 10b, and 10c are formed, thermal processes at about 200° C. are performed in some cases, such as operation tests. During such thermal treatments, the barrier layer 17 functions to prevent diffusion of Al in the Al alloy layer 18 into the substrate surface. Junction leak defective was able to be reduced considerably.

As above, Al diffusion into the substrate surface is prevented by interposing the barrier layer between the buried region of refractory metal such as W and an Al or Al alloy layer, so that wiring patterns with reduced junction leak defective and good heat resistance can be realized.

Since an adhesion layer is not required to be thick, a good buried condition of W without any seam can be obtained, improving a yield of the formation of wiring. If an adhesion layer is made of a Ti single layer or formed thinner, an increase of a contact resistance can be prevented.

Figure 10:
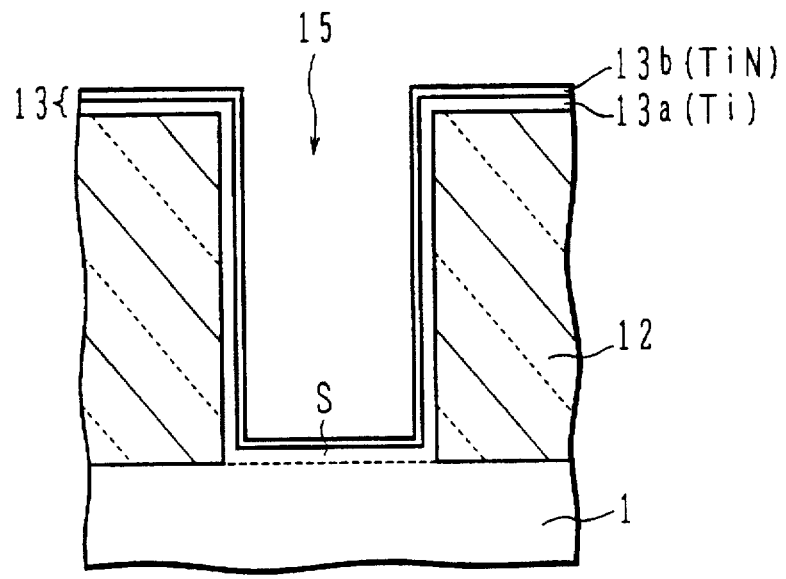
FIG. 10 is a cross sectional view of a substrate illustrating a modification of a process of forming a TiN layer.

FIG. 10 illustrates a modification of the process of forming an adhesion layer (a TiN layer). Like elements to those shown in FIG. 3 are represented by using identical reference numerals.

With this modification illustrated in FIG. 10, after a Ti film 13a is formed by sputtering, the film 13a is successively subjected to low pressure $N_2$ annealing in vacuum to nitride the surface thereof and form a TiN layer 13b. At this time, a titanium silicide $TiS_x$ is formed at a Ti—Si interface S. For example, the Ti film 13a having a thickness of 50 nm at an upper flat area was subjected to $N_2$ annealing at 600° C. and for 60 seconds. A thickness of the TiN film 13b at the bottom of the contact hole was 10 nm, a thickness of the $TiSi_x$ was 20 nm, a thickness of the TiN film 13b over the insulating film 12 was 20 nm, and a thickness of the Ti film 13a thereunder was 40 nm.

This method illustrated in FIG. 10 can be utilized since the total thickness of the adhesion layer 13 is not required to be great, although the TiN layer 13b cannot be made thick. The formation of other layers is the same as the above.

Figure 11:
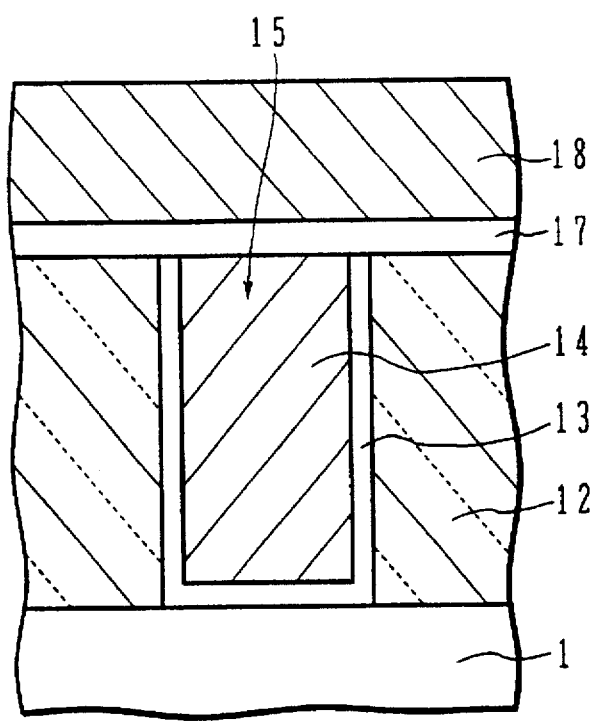
FIG. 11 is a cross sectional view of a substrate showing a wiring structure according to another embodiment of the invention.

FIG. 11 illustrates another embodiment of the invention. Like elements to those shown in FIG. 6 are represented by using identical reference numerals.

The features of the embodiment illustrated in FIG. 11 reside in that an adhesion layer 13 such as Ti and TiN is formed only on the bottom and side wall of a contact hole 15, and that a W layer 14 is formed only in the contact hole 15 by selective CVD. As described above, an insulating film 12 is formed on the semiconductor substrate 1 and a contact hole 15 is formed through the insulating film 12. A barrier metal layer 13 such as Ti and TiN is formed on the substrate surface by sputtering deposition technique as described above. Then a blanket W layer is formed on the barrier layer 13. To form a W plug 14, the blanket W layer is etched back by mixture gas of $SF_6$+Ar until the barrier metal layer 13 is exposed. Upon exposure of the barrier metal layer 13, the etching gas is changed from the mixture gas of $SF_6$+Ar to mixture gas of $Cl_2$+Ar at pressure of 200 mTorr, at RF power of 300 W, and at a substrate temperature of 20° C. The horizontal portion of the barrier metal layer 13 on the insulating layer 12 is removed by the mixture gas of $Cl_2$+Ar until a horizontal portion of the insulating film 12 is exposed, while a top portion of the the W plug is removed. As a result, the top surfaces of the barrier metal layer 13 and the W plug 14 are made to be substantially coplanar. An Al or Al alloy layer 18 is then formed on the barrier layer 17. An anti-reflection layer is formed if necessary, and a laminate of the barrier layer 17 and Al or Al alloy layer 18 is patterned to form wiring.

Also with the wiring structure shown in FIG. 11, the barrier layer 17 can prevent Al diffusion into the substrate surface, improving heat resistance. Since the adhesion layer can be made thin, contact resistance can be reduced.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A method for manufacturing a semiconductor device comprising the steps of:

(a) forming a plurality of contact holes in an insulating film covering a surface of a semiconductor substrate, corresponding to contact areas of different sizes defined in the surface of the semiconductor substrate;

(b) forming a conductive adhesion layer on the insulating film, the adhesion layer covering a bottom and side wall of each of the contact holes;

(c) forming a refractory metal layer on the adhesion layer, the refractory metal layer filling each of the contact holes;

(d) selectively removing the refractory metal layer to partially expose the adhesion layer at a central area of the bottom of one of the contact holes having a larger size and to partially leave the refractory metal layer along a side wall of said one contact hole;

(e) forming a conductive barrier layer over the substrate to contact the exposed area of the adhesion layer;

(f) forming an Al or Al alloy layer covering the barrier layer; and (g) patterning a laminate of the adhesion layer, barrier layer, and Al or Al alloy layer to form desired wiring patterns, the wiring patterns including a left portion of the adhesion layer, a left portion of the refractory metal layer, a left portion of the barrier layer, and a left portion of the Al or Al alloy layer and being electrically connected to associated contact area or areas via associated contact hole or holes.

2. A method according to claim 1, wherein the step of forming a plurality of contact holes is performed by anisotropic etching.

3. A method according to claim 1, wherein the step of forming a refractory metal layer is performed by chemical vapor deposition using reduction of $WF_6$ gas.

4. A method according to claim 1, wherein the step of selectively removing the refractory metal layer is performed by anisotropic plasma etching.

5. A method according to claim 1, wherein the step of forming an adhesion layer and the step of forming a barrier layer are performed by sputtering.

6. A method for manufacturing a semiconductor device comprising the steps of:

(a) forming first and second contact holes having different sizes in an insulating film covering a surface of a semiconductor substrate, corresponding to first and second contact areas having different sizes defined in the surface of said semiconductor substrate, the second contact hole being larger than the first contact hole;

(b) forming a conductive adhesion layer on the insulating film, the adhesion layer covering a bottom and side wall of each of said first and second contact holes;

(c) forming a refractory metal layer on the adhesion layer, the refractory metal layer filling each of the first and second contact holes;

(d) selectively removing the refractory metal layer to leave a fraction of the refractory metal layer in the first contact hole as a first metal layer and to leave another fraction of the refractory metal layer in the second contact hole as a second metal layer, the first metal layer filling the first contact hole, the second metal layer covering the side wall of the second contact hole, and exposing the adhesion layer at a central area of a bottom of the second contact hole;

(e) forming a conductive barrier layer covering the adhesion layer on the insulating film, the first metal layer at an opening of the first contact hole, and the second metal layer and exposed adhesion layer in the second contact hole;

(f) forming an Al or Al alloy layer to cover the barrier layer; and (g) patterning a laminate of the adhesion layer, barrier layer, and Al or Al alloy layer to form first and second wiring patterns, the first wiring pattern including a first left portion of the adhesion layer, the first metal layer, a first left portion of the barrier layer, and a left portion of the Al or Al alloy layer and being electrically connected to the first contact area via the first contact hole, and the second wiring pattern including a second left portion of the adhesion layer, the second metal layer, a second left portion of the barrier layer, and a second portion of the Al or Al alloy layer and being electrically connected to the second contact area via the second contact hole.

7. A method according to claim 6, wherein the step of forming a plurality of contact holes is performed by anisotropic etching.

8. A method according to claim 6, wherein the step of forming a refractory metal layer is performed by chemical vapor deposition using reduction of $WF_6$ gas.

9. A method according to claim 6, wherein the step of selectively removing the refractory metal layer is performed by anisotropic plasma etching.

10. A method according to claim 6, wherein the step of forming an adhesion layer and the step of forming a barrier layer are performed by sputtering.

11. A method for manufacturing a semiconductor device on a substrate comprising the steps of:
   (a) forming an insulating layer on the substrate, the insulating layer having a first hole having a first diameter and a second hole having a second diameter larger than the first diameter;
   (b) forming a first barrier metal layer over the insulating layer so as to cover the first hole and the second hole;
   (c) forming a first conductive wiring layer over the first barrier metal layer;
   (d) removing the first conductive wiring layer so as to leave a first conductive plug in the first hole and a second conductive film over a side wall of the second hole to expose the first conductive wiring layer at an area of a bottom of the second hole; and
   (e) forming a second barrier metal layer over the first conductive plug, the second conductive film, and the first barrier metal layer, the second barrier metal layer contacting the first barrier metal layer at the bottom of the second hole.

12. A method according to claim 11, wherein the first conductive plug and the second conductive film are sandwiched between the first and second barrier metal layers.

13. A method according to claim 11, further comprising the steps of:
   (f) following the step (e), forming a second conductive wiring layer over the substrate;
   (g) forming an anti-reflection layer over the second conductive wiring layer;
   (h) patterning the second conductive wiring layer.

14. A method according to claim 11, wherein the first barrier metal layer comprises a material selected from a group consisting of Ti, TiW, and a laminated layer of Ti and TiN.

15. A method according to claim 14, wherein a thickness of the first barrier metal layer is about 50 nm.

16. A method according to claim 11, wherein the first conductive wiring layer is made of W.

17. A method according to claim 11, wherein the removing step (d) is performed by etching-back the first conductive wiring layer.

18. A method according to claim 11, wherein the second barrier metal layer comprises a material selected from a group consisting of TiN, $WSi_x$, $MoSi_x$, TiW, and the combinations thereof.

19. A method according to claim 11, wherein a thickness of the second barrier metal layer is about 20 nm or more.

20. A method according to claim 13, wherein the second conductive wiring layer consists essentially of a material selected from a group consisting of Al and Al—Si—Cu alloy.

21. A method for manufacturing a semiconductor device, comprising the steps of:
   (a) providing a substrate;
   (b) forming an insulating layer on the substrate, the insulating layer having a first hole having a first diameter and a second hole having a second diameter larger than the first diameter;
   (c) forming a first barrier metal layer over the insulating layer so as to cover the first hole and the second hole;
   (d) forming a first conductive plug in the first hole and a second conductive film having a sloping topography over a side wall of the second hole, the second conductive film partially expose the first barrier metal layer at a bottom of the second hole;
   (e) forming a second barrier metal layer over the first conductive plug, the second conductive film, and the first barrier metal layer, to sandwich the first conductive plug and the second conductive film by the first and second barrier metal layers, the second barrier metal layer partially contact the first barrier metal layer at the bottom of the second hole; and
   (f) forming a second conductive layer over the substrate.

22. A method according to claim 21, further comprising the steps of:
   (g) forming an anti-reflection layer over the second conductive wiring layer; and
   (h) patterning the second conductive wiring layer.

23. A method according to claim 21, wherein the first barrier metal layer comprises a material selected from a group consisting of Ti, TiW, and a laminated layer of Ti and TiN.

24. A method according to claim 21, wherein the first conductive wiring layer is made of W.

25. A method according to claim 21, wherein the second barrier metal layer comprises a material selected from a group consisting of TiN, $WSi_x$, $MoSi_x$, TiW, and the combinations thereof.

26. A method according to claim 21, wherein the second conductive wiring layer consists essentially of a material selected from a group consisting of Al and Al—Si—Cu alloy.

* * * * *